(12) United States Patent
Lin et al.

(10) Patent No.: US 10,164,152 B2
(45) Date of Patent: Dec. 25, 2018

(54) LIGHT EMITTING DIODE CHIP

(71) Applicant: PlayNitride Inc., Tainan (TW)

(72) Inventors: Tzu-Yang Lin, Tainan (TW); Yu-Hung Lai, Tainan (TW); Yun-Li Li, Tainan (TW); Yu-Yun Lo, Tainan (TW)

(73) Assignee: PlayNitride Inc., Tainan (TW)

( * ) Notice: Subject to any disclaimer, the term of this patent is extended or adjusted under 35 U.S.C. 154(b) by 0 days.

(21) Appl. No.: 15/424,544

(22) Filed: Feb. 3, 2017

(65) Prior Publication Data
US 2018/0166606 A1    Jun. 14, 2018

(30) Foreign Application Priority Data

Dec. 9, 2016  (TW) .............................. 105140787 A

(51) Int. Cl.
*H01L 33/20*  (2010.01)
*H01L 25/075* (2006.01)
*H01L 33/38*  (2010.01)

(52) U.S. Cl.
CPC .......... *H01L 33/20* (2013.01); *H01L 25/0753* (2013.01); *H01L 33/382* (2013.01)

(58) Field of Classification Search
CPC ....... H01L 33/02; H01L 33/20; H01L 33/382; H01L 33/22; H01L 33/24; H01L 33/38
See application file for complete search history.

(56) References Cited

U.S. PATENT DOCUMENTS

| | | | | |
|---|---|---|---|---|
| 5,753,940 A | * | 5/1998 | Komoto | H01L 33/20 257/103 |
| 6,255,129 B1 | * | 7/2001 | Lin | H01L 33/20 257/100 |
| 2009/0159870 A1 | | 6/2009 | Lin et al. | |
| 2009/0179211 A1 | * | 7/2009 | Yoo | H01L 33/20 257/98 |
| 2012/0074441 A1 | * | 3/2012 | Seo | H01L 27/153 257/91 |

(Continued)

FOREIGN PATENT DOCUMENTS

| | | |
|---|---|---|
| TW | 200637041 | 10/2006 |
| TW | 201143129 | 12/2011 |
| TW | M496237 | 2/2015 |

OTHER PUBLICATIONS

"Office Action of Taiwan Counterpart Application", dated May 4, 2017, p. 1-p. 7.

(Continued)

*Primary Examiner* — David Spalla
(74) *Attorney, Agent, or Firm* — J.C. Patents

(57) ABSTRACT

A light emitting diode (LED) chip has an inclined notch. The inclined notch has at least one inclined surface. The LED chip includes a first-type doped semiconductor layer, a second-type doped semiconductor layer, a light emitting layer, a first electrode, and a second electrode. The light emitting layer is located between the first-type doped semiconductor layer and the second-type doped semiconductor layer. The inclined surface is inclined with respect to the light emitting layer. The first electrode is electrically connected to the first-type doped semiconductor layer. The second electrode is electrically connected to the second-type doped semiconductor layer. The inclined notch is disposed in the light emitting layer.

16 Claims, 7 Drawing Sheets

(56) References Cited

U.S. PATENT DOCUMENTS

2015/0270446 A1* 9/2015 Neumann ........... H01L 33/0079
　　　　　　　　　　　　　　　　　　　257/98
2016/0133788 A1* 5/2016 Kim ........................ H01L 33/20
　　　　　　　　　　　　　　　　　　　257/98

OTHER PUBLICATIONS

"Office Action of Taiwan Counterpart Application", dated Jul. 30, 2018, p. 1-p. 7.

* cited by examiner

LIGHT EMITTING DIODE CHIP

CROSS-REFERENCE TO RELATED APPLICATION

This application claims the priority benefit of Taiwan application serial no. 105140787, filed on Dec. 9, 2016. The entirety of the above-mentioned patent application is hereby incorporated by reference herein and made a part of this specification.

FIELD OF THE INVENTION

The invention relates to a light emitting chip. More specifically, the invention relates to a light emitting diode (LED) chip.

DESCRIPTION OF RELATED ART

With prowess in semiconductor technologies, light emitting diodes (LED) now have advantages of high brightness and high color rendering as well as low power consumption, small volume, low driving voltage, mercury free, and so forth. Therefore, the LEDs have been extensively applied in the field of displays and illumination.

However, as to the development of the LED at the present stage, how to improve the light emitting efficiency of the LED has become one of the most prevailing topics in the field pertinent to the LED. The light emitting efficiency of the LED is the product obtained by multiplying an internal quantum efficiency (IQE) by a light extraction efficiency (LEE). In general, the IQE of a quality LED can reach 90% or more, while the LEE is lower than the IQE. When a portion of light generated by a light emitting layer is transmitted to an interface between a chip and the air, and when an incident angle of the portion of light is greater than a critical angle, a total internal reflection (TIR) of the portion of light may occur at the aforesaid interface, which leads to the low LEE. After the portion of light undergoes the total reflection within the chip and multiple total reflections by upper and lower surfaces of the LED chip, the portion of light is absorbed by materials in the LED chip, thus reducing the LEE. Accordingly, how to enhance the LEE of the LED has become one of the important research topics.

SUMMARY OF THE INVENTION

The invention provides a light emitting diode (LED) chip with a good light extraction efficiency (LEE).

An embodiment of the invention provides a LED chip with an inclined notch. The inclined notch has a plurality of inclined surfaces. The LED chip includes a first-type doped semiconductor layer, a second-type doped semiconductor layer, a light emitting layer, a first electrode, and a second electrode. The light emitting layer is located between the first-type doped semiconductor layer and the second-type doped semiconductor layer. The inclined surfaces are inclined with respect to the light emitting layer. The first electrode is electrically connected to the first-type doped semiconductor layer. The second electrode is electrically connected to the second-type doped semiconductor layer. The inclined notch is disposed in the light emitting layer.

In an embodiment of the invention, the inclined notch continuously surrounds one portion of the light emitting layer.

In an embodiment of the invention, the inclined notch discontinuously surrounds one portion of the light emitting layer.

In an embodiment of the invention, the inclined notch surrounds one portion of the light emitting layer long an edge of the LED chip.

In an embodiment of the invention, the inclined notch includes a first sub-inclined notch and a second sub-inclined notch. The first sub-inclined notch is connected to the second sub-inclined notch. The first sub-inclined notch surrounds one portion of the light emitting layer, and the second sub-inclined notch surrounds the other portion of the light emitting layer and the second electrode.

In an embodiment of the invention, the LED chip is a micro LED chip, a resonant cavity LED chip, or a thin film LED chip.

In an embodiment of the invention, a refractive index of substance in the inclined notch is smaller than a refractive index of the first-type doped semiconductor layer, a refractive index of the second-type doped semiconductor layer, and a refractive index of the light emitting layer.

In an embodiment of the invention, the substance inside the inclined notch is air.

In an embodiment of the invention, the LED chip further includes an optical clear adhesive (OCA). The OCA is located in the inclined notch.

In an embodiment of the invention, in a cross-section of the LED chip, the inclined notch is shaped as an inverted triangle, a triangle, a trapezoid, an inverted trapezoid, or a combination thereof.

In an embodiment of the invention, the LED chip includes a through hole. The through hole penetrates the first-type doped semiconductor layer, the light emitting layer, and one portion of the second-type doped semiconductor layer. The LED chip further includes an insulation layer. The insulation layer is disposed on a sidewall of the through hole and one portion of an upper surface of the first-type doped semiconductor layer. The second electrode is located in the through hole and electrically connected to the second-type doped semiconductor layer, and the insulation layer is configured to electrically insulate the second electrode from the first-type doped semiconductor layer and the light emitting layer.

In an embodiment of the invention, a depth of the inclined notch relative to an upper surface of the first-type doped semiconductor layer is greater than a height of the light emitting layer relative to the upper surface of the first-type doped semiconductor layer.

In an embodiment of the invention, a ratio of the depth of the inclined notch relative to the upper surface of the first-type doped semiconductor layer to the height of the light emitting layer relative to the upper surface of the first-type doped semiconductor layer is greater than 1 but smaller than or equal to 10.

In view of the forgoing, the LED chip in the embodiments of the invention has the inclined notch. The inclined surfaces of the inclined notch are inclined with respect to the light emitting layer, and the inclined notch is disposed in the light emitting layer. When a light is emitted by the light emitting layer, the TIR of most of the light occurs at the inclined surfaces of the inclined notch, and most of the light is collectively emitted from the LED chip. Thereby, the LED chip provided in the embodiments of the invention has good LEE.

To make the aforementioned and other features and advantages of the invention more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the invention.

DESCRIPTION OF THE EMBODIMENTS

Figure 1A:
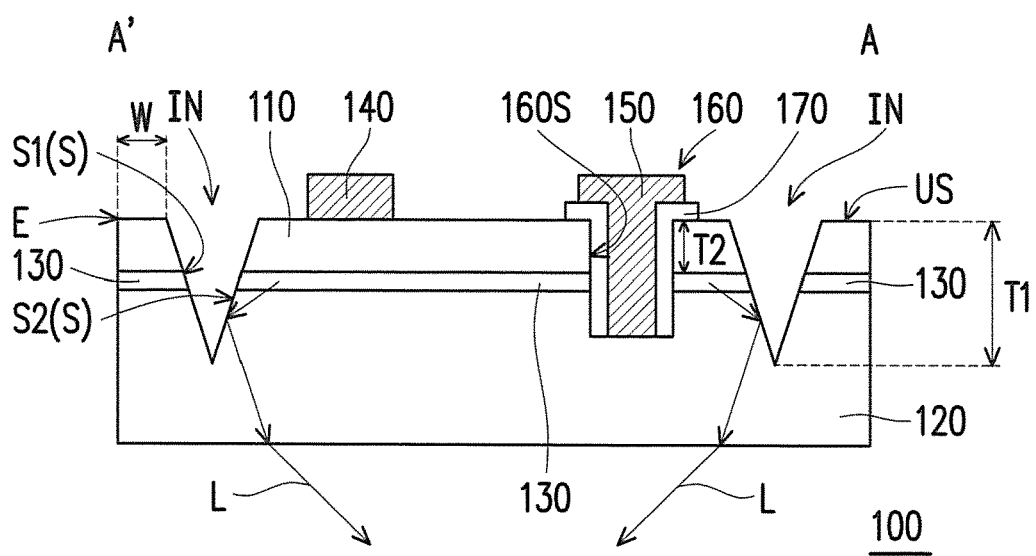
FIG. 1A is a top view of an LED chip according to an embodiment of the invention.
Figure 1B:
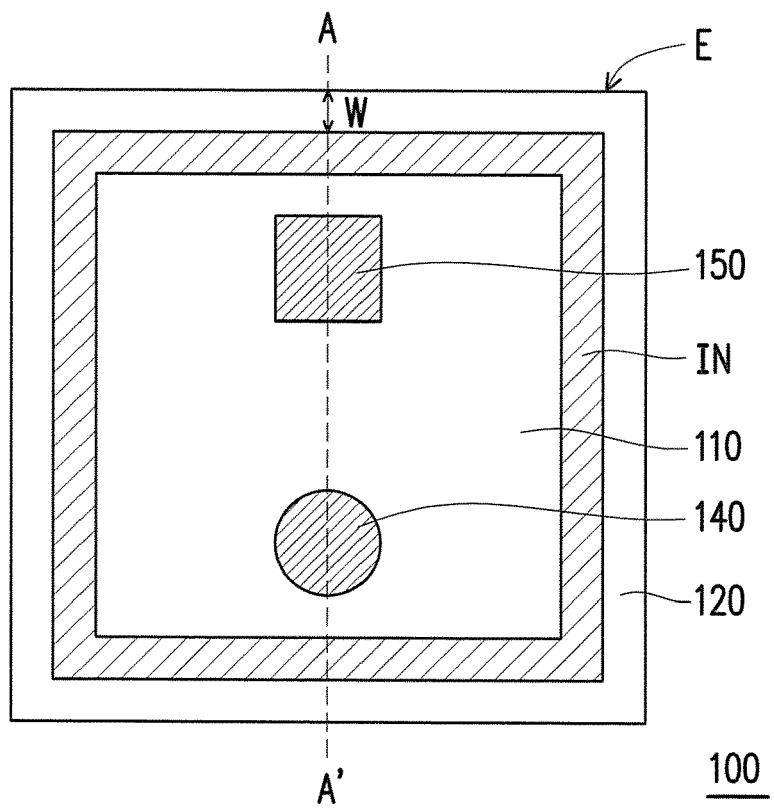
FIG. 1B is a schematic cross-sectional view taken along a tangent line A-A' in FIG. 1A.
Figure 1C:
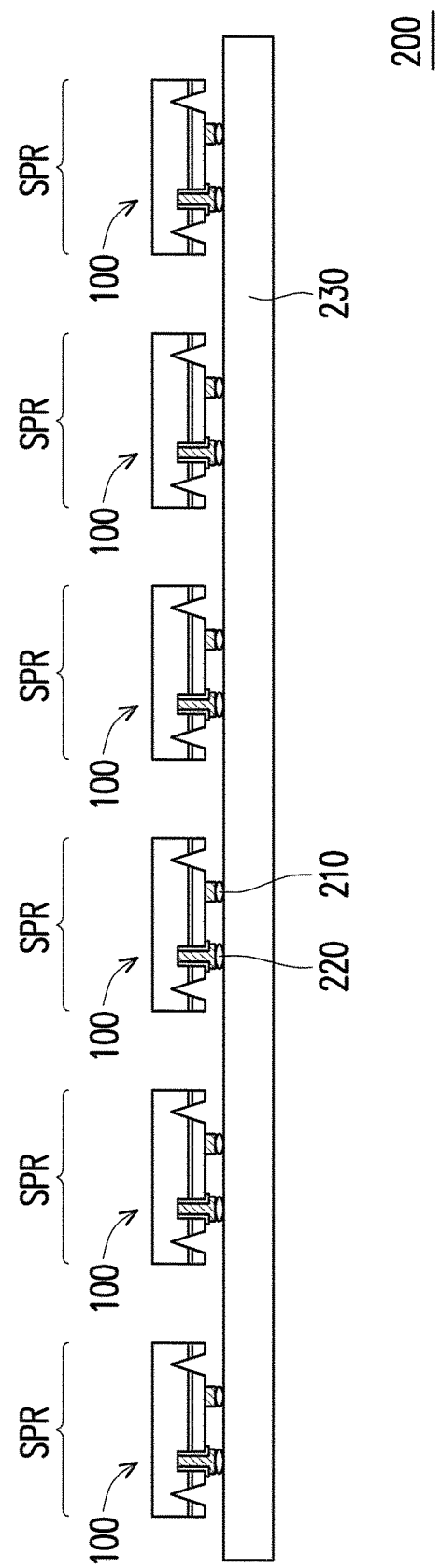
FIG. 1C is a schematic cross-sectional view illustrating an LED chip applied to a display panel according to an embodiment of the invention.

FIG. 1A is a top view of an LED chip according to an embodiment of the invention. FIG. 1B is a schematic cross-sectional view taken along a tangent line A-A' in FIG. 1A. FIG. 1C is a schematic cross-sectional view illustrating an LED chip applied to a display panel according to an embodiment of the invention.

Referring to FIG. 1A and FIG. 1B, in the embodiment, a LED chip 100 has an inclined notch IN. The inclined notch IN has a plurality of inclined surfaces S. For example, the inclined notch IN has two inclined surfaces S1 and S2, and the inclined surface S1 is connected to the inclined surface S2. The LED chip 100 includes a first-type doped semiconductor layer 110, a second-type doped semiconductor layer 120, a light emitting layer 130, a first electrode 140, and a second electrode 150. The light emitting layer 130 is located between the first-type doped semiconductor layer 110 and the second-type doped semiconductor layer 120. The inclined surfaces S1 and S2 are inclined with respect to the light emitting layer 130. The first electrode 140 is electrically connected to the first-type doped semiconductor layer 110. The second electrode 150 is electrically connected to the second-type doped semiconductor layer 120. Referring to FIG. 1B, the inclined notch IN is disposed in the light emitting layer 130.

Specifically, in the embodiment, the inclined notch IN is indented in an upper surface US of the LED chip 100. The inclined notch IN is, for example, formed in the LED chip 100 by etching and disposed in the light emitting layer 130, but the invention is not limited thereto. A refractive index of substance in the inclined notch IN is smaller than a refractive index of the first-type doped semiconductor layer 110, a refractive index of the second-type doped semiconductor layer 120, and a refractive index of the light emitting layer 130. Here, the refractive index of the substance in the inclined notch IN is, for example, between 1 and 2.5; a refractive index of a light output interface of the LED chip 100 and the inclined notch IN changes, and thus the TIR of a light L increases. In the embodiment, the substance inside the inclined notch IN is air. In another embodiment, the LED chip 100 further includes an optical clear adhesive (OCA) located in the inclined notch IN, such that a structural strength of the LED chip 100 is further increased. A refractive index of the OCA is smaller than the refractive index of the first-type doped semiconductor layer 110, the refractive index of the second-type doped semiconductor layer 120, and the refractive index of the light emitting layer 130. The OCA may be selected from titanium dioxide or silicon dioxide, but the invention is not limited thereto. When the light L is emitted by the light emitting layer 130, most of the light L is transmitted to the inclined surface S1 or the inclined surface S2 of the inclined notch IN and encounters TIR at the inclined surfaces S1 and S2 of the inclined notch IN, and thus most of the light L is collectively emitted from the LED chip 100. Hence, the LED chip 100 in the embodiment has a good LEE.

In the embodiment, the inclined notch IN continuously surrounds one portion of the light emitting layer 130, meaning that the light emitting layer 130 is divided into at least two portions by the inclined notch IN located in the light emitting layer 130. Specifically, the inclined notch IN surrounds one portion of the light emitting layer 130 along an edge E of the LED chip 100. Preferably, the inclined notch IN is conformal to the edge E. Here, any distance W between the inclined notch IN and the edge E is, for example, smaller than or equal to 30 micrometers, but if the any distance W exceeds 30 micrometers, a light emitting region of the LED chip 100 is decreased, and a light emitting efficiency is lowered. Moreover, W here refers to the shortest distance between the inclined notch IN and the edge E, but the invention is not limited thereto. Through a design of the inclined notch IN surrounding one portion of the light emitting layer 130 along the edge E of the LED chip 100, a sacrifice in size of the light emitting region of the LED chip 100 may be avoided, and thereby the LED chip 100 may achieve a higher LEE. A cross-section of the inclined notch IN along the tangent line A-A' in the LED chip 100 is shaped as an inverted triangle. A depth T1 of the inclined notch IN relative to the upper surface US of the first-type doped semiconductor layer 110 is greater than a height T2 of the light emitting layer 130 relative to the upper surface US of the first-type doped semiconductor layer 110, indicating that the depth of the inclined notch IN exceeds the height of the light emitting layer 130. Furthermore, the depth of the inclined notch IN doesn't exceed the height of the second-type doped semiconductor layer 120. A range of the depth of the inclined notch IN is greater than or equal to 1 micrometer but smaller than a thickness of the LED chip 100. Moreover, a ratio of the depth T1 of the inclined notch IN relative to the upper surface US of the first-type doped semiconductor layer 110 to the height T2 of the light emitting layer 130 relative to the upper surface US of the first-type doped semiconductor layer 110 is preferably greater than 1 but smaller than or equal to 10. If the ratio exceeds 10, the structural strength of the LED chip 100 may be reduced.

In the embodiment, the LED chip 100 includes a through hole 160. The through hole 160 penetrates the first-type doped semiconductor layer 110, the light emitting layer 130, and one portion of the second-type doped semiconductor layer 120. The LED chip 100 further includes an insulation layer 170. The insulation layer 170 is disposed on a sidewall 160S of the through hole 160 and one portion of an upper surface 110US of the first-type doped semiconductor layer 110. The second electrode 150 is disposed in the through hole 160 and is electrically connected to the second-type doped semiconductor layer 120. The insulation layer 170 is configured to electrically insulate the second electrode 150 from the first-type doped semiconductor layer 110 and the light emitting layer 130. Moreover, the insulation layer 170 can be disposed in the inclined notch IN. In the embodiment, a material of the insulation layer 170 is, for example, silicon dioxide ($SiO_2$), but the invention is not limited thereto. In addition, the second electrode 150 protrudes on the upper surface US of the LED chip 100a.

In the embodiment, the first-type doped semiconductor layer is, for example, a P-type doped semiconductor layer. A material of the P-type doped semiconductor layer is, for example, P-type gallium nitride (p-GaN). The second-type doped semiconductor layer is, for example, a N-type doped semiconductor layer. A material of the N-type doped semiconductor layer is, for example, N-type gallium nitride (n-GaN), but the invention is not limited thereto. The emitting layer 130 may, for example, have a multiple quantum well (MQW) structure that includes a plurality of quantum wells and a plurality of quantum barriers alternately and repetitively arranged. Furthermore, a material of the light emitting layer 130 includes, for example, multi-layer indium gallium nitride (InGaN) and multi-layer gallium nitride (GaN) stacked alternately. Through adjusting the ratio of indium or gallium in the light emitting layer 130, the light emitting layer 130 may emit light with different ranges of luminescent wavelengths. It should be noted that the material of the light emitting layer 130 listed herein merely serves as an example and should not be limited to InGaN and GaN. A material of the first electrode 140 and the second electrode 150 is selected from gold (Au), tin (Sn), nickel (Ni), titanium (Ti), indium (In), an alloy of the foregoing materials, or a combination thereof, for instance, but the invention is not limited thereto.

As shown in FIG. 1B, the first electrode 140 is not shaped as the second electrode 150. Specifically, the first electrode 140 is shaped, for example, as a circle, and the second electrode 150 is shaped, for example, as a square; however, the invention is not limited thereto. Here, only one first electrode 140 and one second electrode 150 are schematically shown, but the invention is not limited thereto.

In other embodiments, the LED chip 100 may be, for example, a resonant cavity light emitting diode (RC LED) chip or a thin film LED chip, but the invention is not limited thereto.

As shown in FIG. 1C, the LED chip 100 in the embodiment is, for example, a micro light emitting diode (μLED) with a micrometer-scale size, for example. Specifically, a length of a diagonal of the LED chip 100 falls between 1 micrometer and 100 micrometers. Moreover, the LED chip 100 in the embodiment is, for example, a flip-chip type micro light emitting diode, which could have better LEE because the inclined notch IN is away from the light emitting side of the LED chip 100.

Referring to FIG. 1C, in the embodiment, the LED chip 100 is, for example, applied on a display panel 200. The display panel 200 has a plurality of sub-pixel regions SPR. The display panel 200 includes a plurality of first pads 210, a plurality of second pads 220, a plurality of LED chips 100, and a back plate 230. The display panel 200 is embodied as a micro LED display panel. The back plate 230 is embodied as a thin film transistor (TFT) substrate. One of the first pads 210 is bonded to the first electrode 210 of the LED chip 100. One of the second pads 220 is bonded to the second electrode 220 of the LED chip 100. A material of the first pads 210 and the second pads 220 is selected from In, Sn, or an alloy thereof (In/Sn), but the invention is not limited thereto. The first pads 210 and the second pads 220 are disposed on the back plate 230. One of the LED chips 100, one of the first pads 210, and one of the second pads 220 are located in one of the sub-pixel regions SPR of the display panel 200.

Whether the corresponding LED chip 100 in the sub-pixel region SPR emits light is controlled by the display panel 200 through, for example, an driver unit (not shown), a plurality of data lines (not shown), a plurality of scan lines (not shown), and a plurality of transistors, and thereby, the light displayed in the sub-pixel region SPR is further controlled. An image is formed together by the lights emitted from the sub-pixel regions SPR. People having ordinary skill in the art may have sufficient teaching, suggestion, and implementation illustration as to how to operate and implement the display panel 200, and thus no further details are provided hereinafter.

Since the LED chip 100 in the embodiment has a higher LEE, when the LED chip 100 is applied in the display panel 200, the light emitting efficiency of the display panel 200 may be further enhanced.

It should be noted that parts of the content in the previous embodiments are used in the following embodiments, and repeated description of the same technical content is omitted. The descriptions of the same elements may be found in the previous embodiments and are not repeated hereinafter.

Figure 2A:
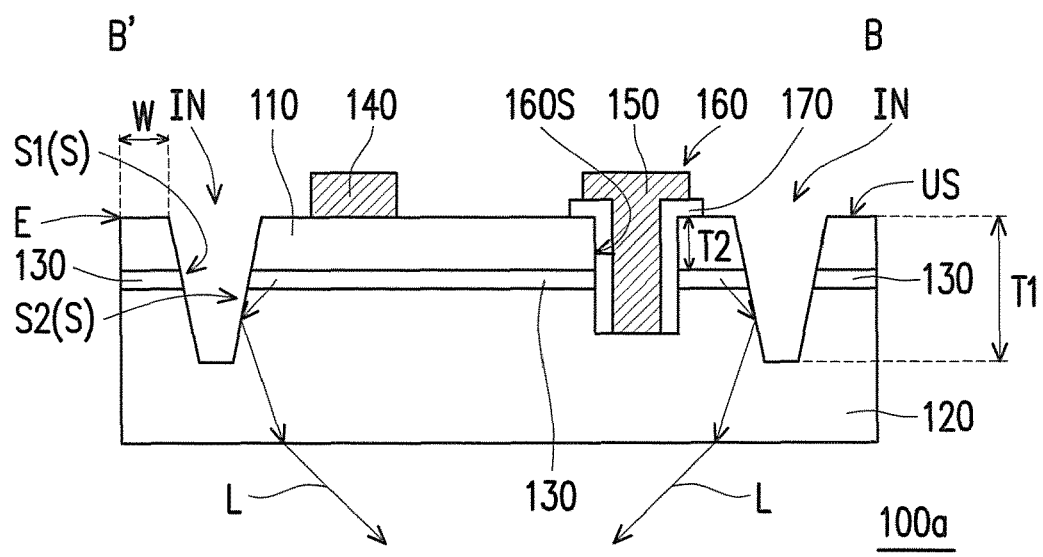
FIG. 2A is a top view of an LED chip according to another embodiment of the invention.
Figure 2B:
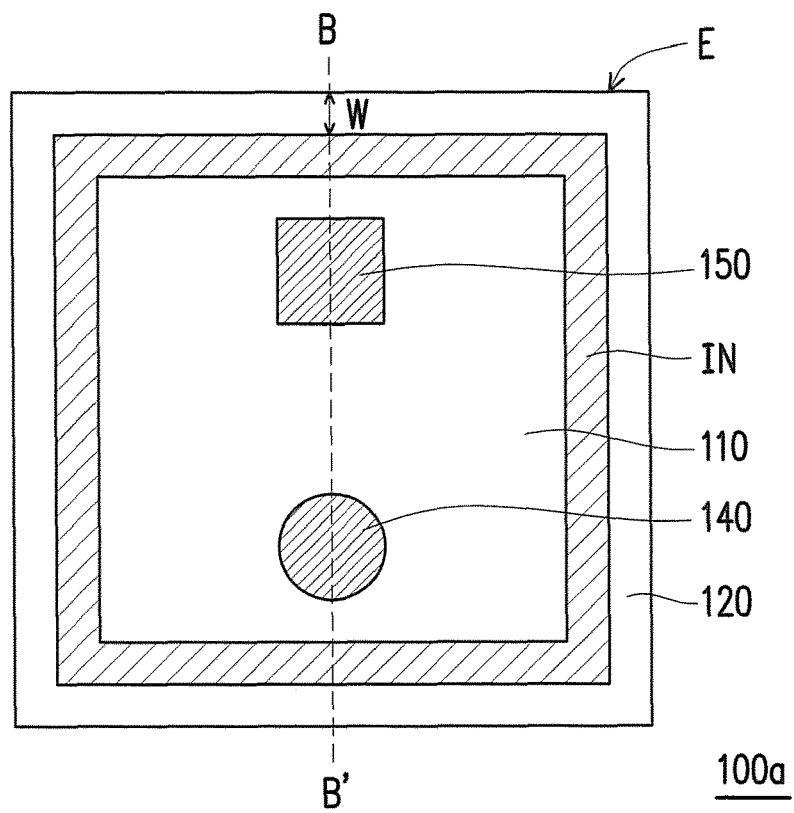
FIG. 2B is a schematic cross-sectional view taken along a tangent line B-B' in FIG. 2A.

FIG. 2A is a top view of an LED chip according to another embodiment of the invention. FIG. 2B is a schematic cross-sectional view taken along a tangent line B-B' in FIG. 2A.

The LED chip 100a in FIG. 2A and FIG. 2B is substantially similar to the LED chip 100 in FIG. 1A and FIG. 1B, while a difference therebetween is that a cross-section of the inclined notch IN along the tangent line B-B' in the LED chip 100a is shaped as an inverted trapezoid; therefore, the emitted light has a better light pattern.

Figure 3A:
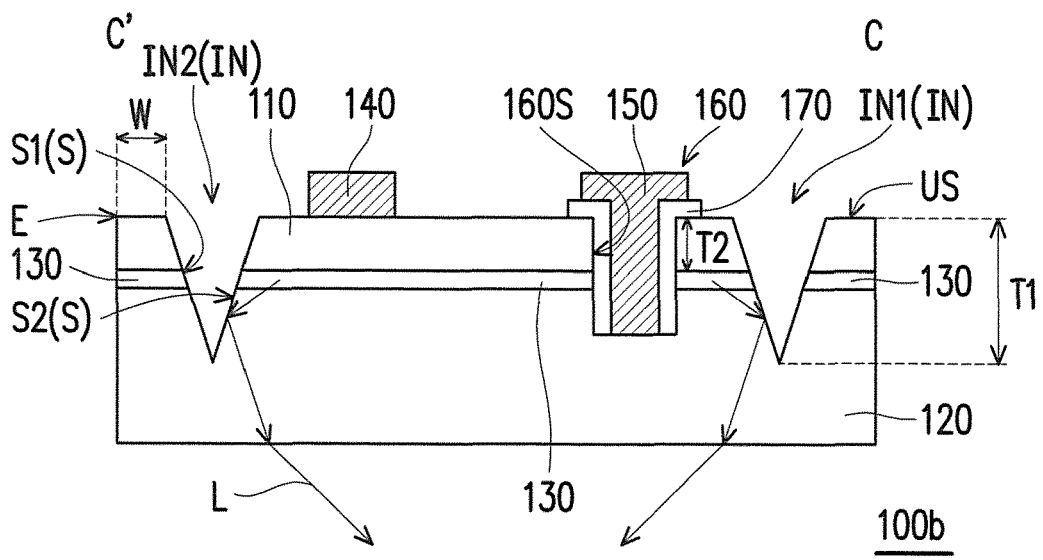
FIG. 3A is a top view of an LED chip according to still another embodiment of the invention.
Figure 3B:
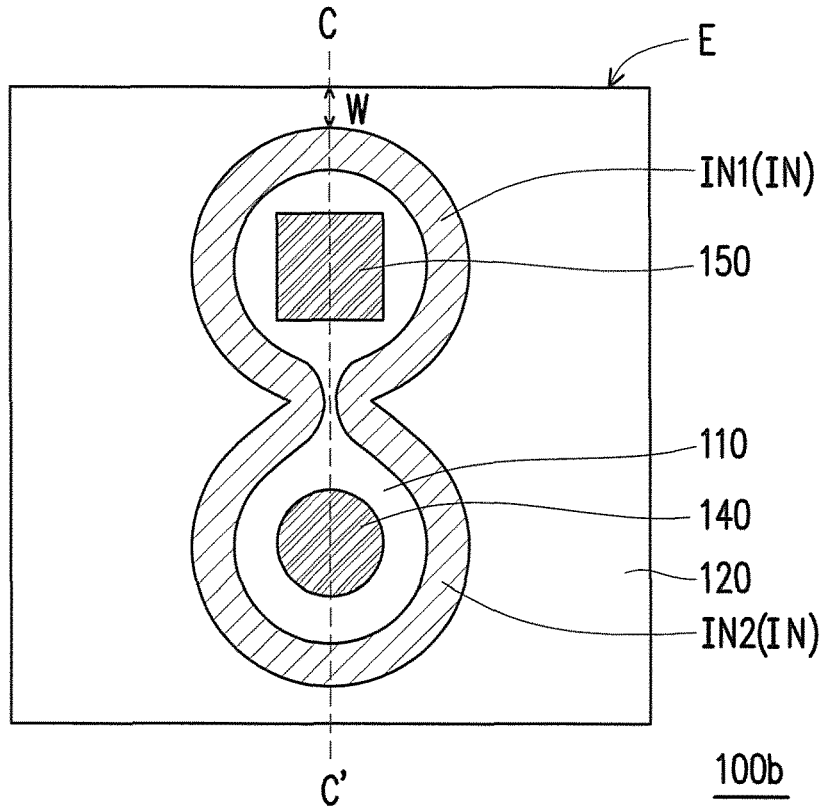
FIG. 3B is a schematic cross-sectional view taken along a tangent line C-C' in FIG. 3A.

FIG. 3A is a top view of an LED chip according to still another embodiment of the invention. FIG. 3B is a schematic cross-sectional view taken along a tangent line C-C' in FIG. 3A. A LED chip 100b in FIG. 3A and FIG. 3B is substantially similar to the LED chip 100 in FIG. 1A and FIG. 1B, while a difference therebetween is that the inclined notch IN includes a first sub-inclined notch IN1 and a second sub-inclined notch IN2. The first sub-inclined notch NI1 is connected to the second sub-inclined notch IN2. The first sub-inclined notch IN1 surrounds one portion of the light emitting layer 130 and the first electrode 140, and the second sub-inclined notch NI2 surrounds the other portion of the light emitting layer 130 and the second electrode 150. In other words, as shown in FIG. 3B, a pattern formed by the first sub-inclined notch IN1 and the second sub-inclined notch IN2 is, for example, shaped in a manner similar to a digit 8. Moreover, the first sub-inclined notch IN1 may be discontinuously connected to the second sub-inclined notch IN2; for example, the first sub-inclined notch IN1 discontinuously surrounds one portion of the light emitting layer 130 and the first electrode 140, and the second sub-inclined notch IN2 discontinuously surrounds the other portion of the light emitting layer 130 and the second electrode 150, or the first sub-inclined notch IN1 may also be continuously connected to the second sub-inclined notch IN2, and for example, the pattern shaped as the digit 8 is thereby formed, but the invention is not limited thereto.

Figure 4A:
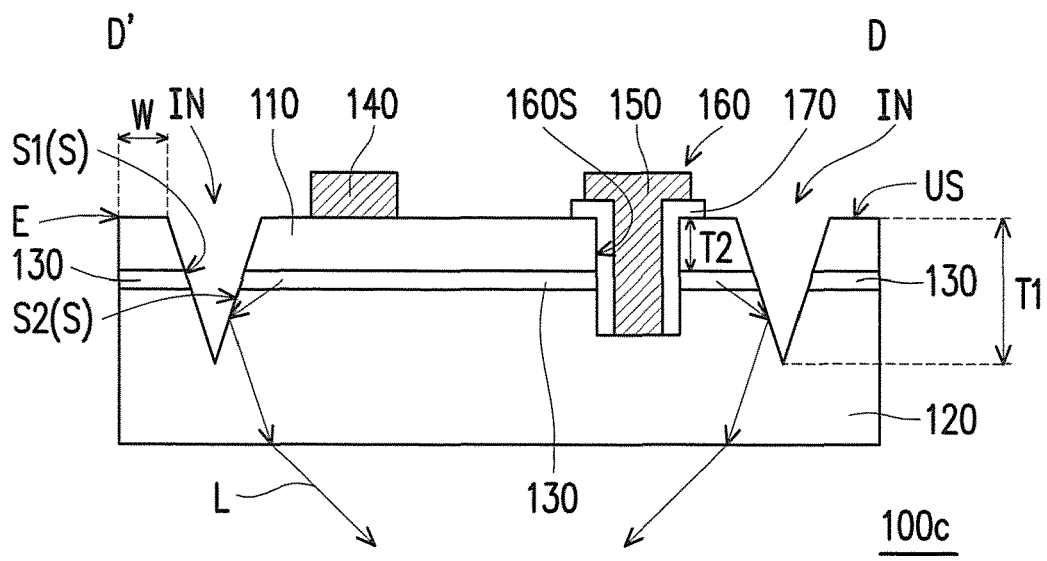
FIG. 4A is a top view of an LED chip according to yet another embodiment of the invention.
Figure 4B:
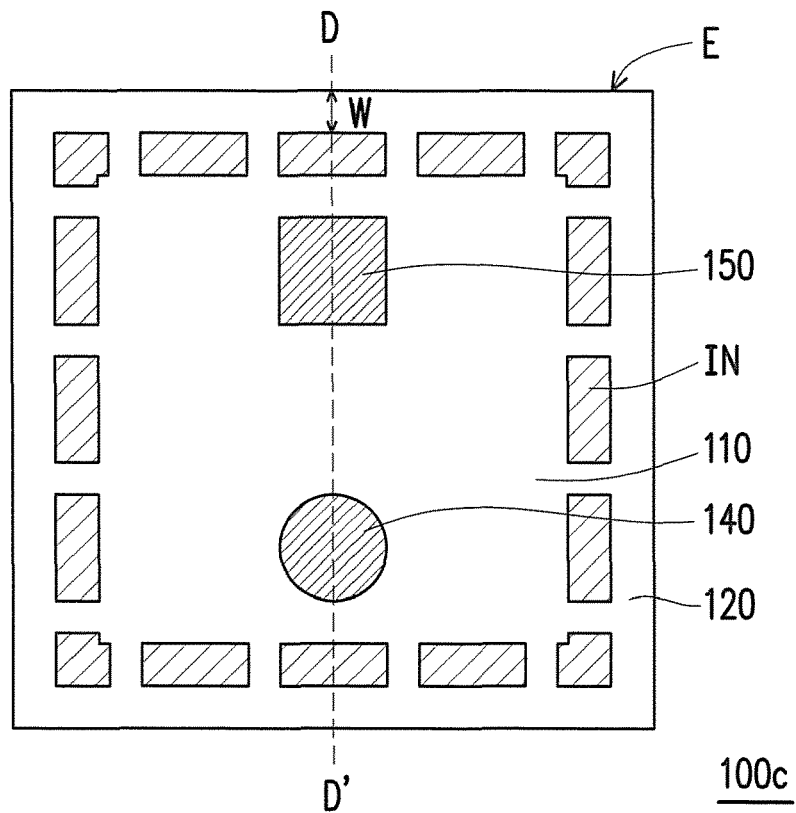
FIG. 4B is a schematic cross-sectional view taken along a tangent line D-D' in FIG. 4A.

FIG. 4A is a top view of an LED chip according to yet another embodiment of the invention. FIG. 4B is a schematic cross-sectional view taken along a tangent line D-D' in FIG. 4A.

A LED chip 100c in FIG. 4A and FIG. 4B is substantially similar to the LED chip 100 in FIG. 1A and FIG. 1B, while a difference is that the inclined notch IN discontinuously surrounds the light emitting layer 130, such that the LEE is enhanced, and that a decrease in the light emitting region can be avoided.

Figure 5A:
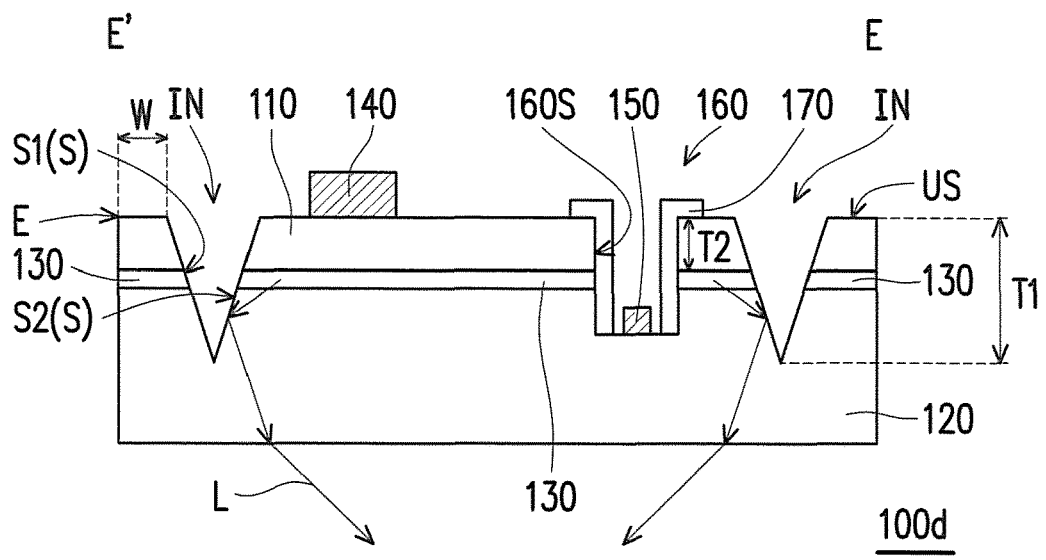
FIG. 5A is a top view of an LED chip according to still another embodiment of the invention.
Figure 5B:
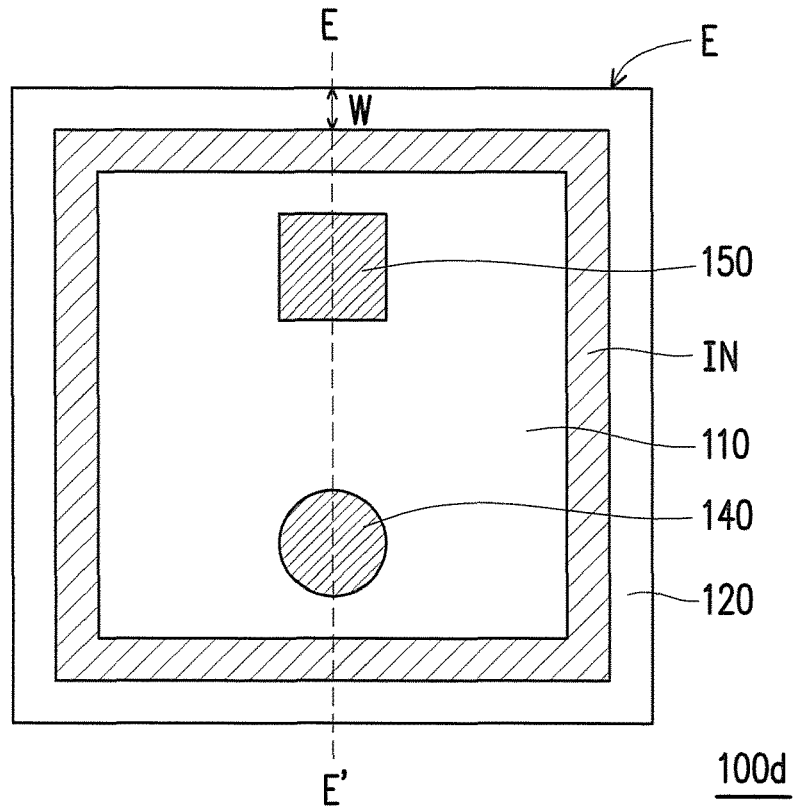
FIG. 5B is a schematic cross-sectional view taken along a tangent line E-E' in FIG. 5A.

FIG. 5A is a top view of an LED chip according to still another embodiment of the invention. FIG. 5B is a schematic cross-sectional view taken along a tangent line E-E' in FIG. 5A.

A LED chip 100d in FIG. 5A and FIG. 5B is substantially similar to the LED chip 100 in FIG. 1A and FIG. 1B, while a difference is that the second electrode 150 is located in the through hole 160, and the second electrode 150 does not protrude on the upper surface US of the LED chip 100d.

Figure 6A:
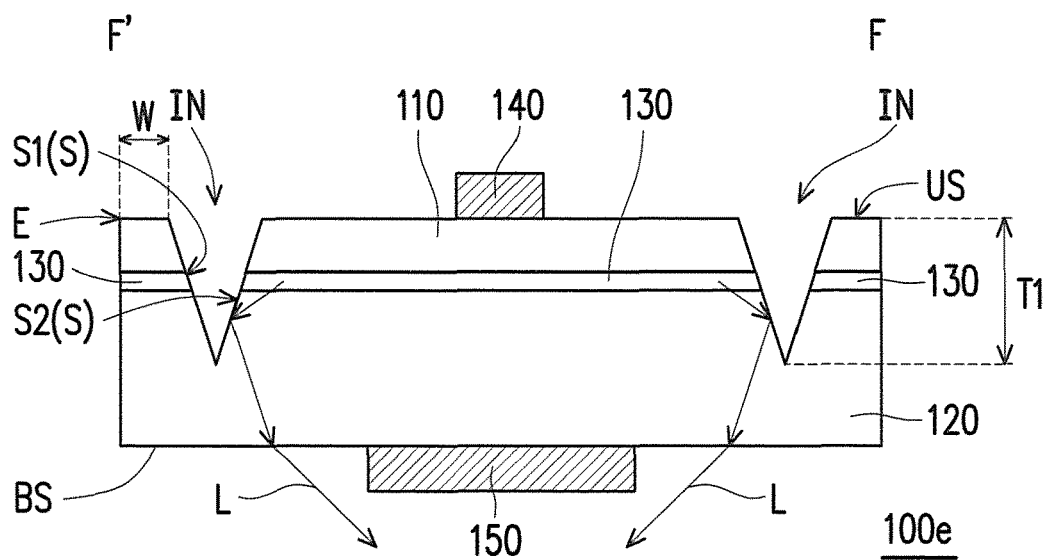
FIG. 6A is a top view of an LED chip according to still another embodiment of the invention.
Figure 6B:
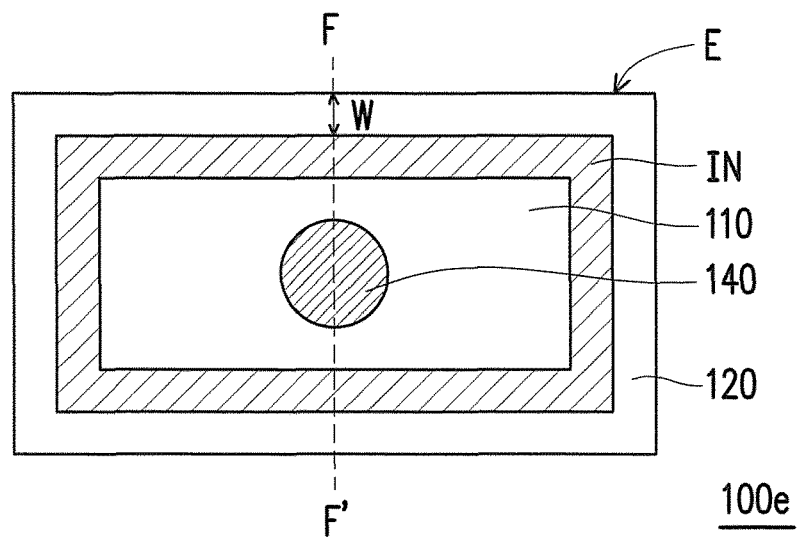
FIG. 6B is a schematic cross-sectional view taken along a tangent line F-F' in FIG. 6A.

FIG. 6A is a top view of an LED chip according to another embodiment of the invention. FIG. 6B is a schematic cross-sectional view taken along a tangent line F-F' in FIG. 6A. A LED chip 100e in FIG. 6A and FIG. 6B is substantially similar to the LED chip 100 in FIG. 1A and FIG. 1B, while a difference is that the LED chip 100e is a vertical LED. In the embodiment, the inclined notch IN is indented in the upper surface US of the LED chip 100. Alternatively, the inclined notch IN may also be indented in the lower surface BS of the LED chip 100, such that the inclined notch IN of which a cross-section is shaped as a triangle or a trapezoid is formed; however, the invention is not limited thereto.

In view of the forgoing, the LED chip provided in the embodiments of the invention has the inclined notch. The inclined surfaces of the inclined notch are inclined with respect to the light emitting layer, and the inclined notch is disposed in the light emitting layer. When a light is emitted by the light emitting layer, most of the light undergoes the TIR at the inclined surfaces of the inclined notch, and thereby most of the light is collectively emitted from the LED chip. As a result, the LED chip provided in the embodiments of the invention has good LEE.

It will be apparent to those skilled in the art that various modifications and variations can be made to the disclosed embodiments without departing from the scope or spirit of the invention. In view of the foregoing, it is intended that the invention covers modifications and variations provided that they fall within the scope of the following claims and their equivalents.

What is claimed is:

1. A light emitting diode chip having an inclined notch, the inclined notch having a plurality of inclined surfaces, the light emitting diode chip comprising:
    a first-type doped semiconductor layer;
    a second-type doped semiconductor layer;
    a light emitting layer located between the first-type doped semiconductor layer and the second-type doped semiconductor layer, the inclined surfaces being inclined with respect to the light emitting layer;
    a first electrode electrically connected to the first-type doped semiconductor layer; and
    a second electrode electrically connected to the second-type doped semiconductor layer, wherein the inclined notch is disposed in the light emitting layer, and the inclined notch, the first electrode and the second electrode are disposed on the same side away from a light emitting surface of the light emitting diode chip, the inclined notch surrounds the first electrode and the second electrode,
    wherein the inclined notch comprises a first sub-inclined notch and a second sub-inclined notch, the first sub-inclined notch is connected to the second sub-inclined notch and surrounds the first electrode, and the second sub-inclined notch surrounds the second electrode, an orthographic projection of the first sub-inclined notch on the light emitting surface does not overlap with an orthographic projection of the second sub-inclined notch on the light emitting surface.

2. The light emitting diode chip according to claim 1, wherein the inclined notch continuously surrounds one portion of the light emitting layer.

3. The light emitting diode chip according to claim 1, wherein the inclined notch discontinuously surrounds one portion of the light emitting layer.

4. The light emitting diode chip according to claim 1, wherein the inclined notch surrounds one portion of the light emitting layer along the edge of the light emitting diode chip.

5. The light emitting diode chip according to claim 1, wherein the first sub-inclined notch surrounds one portion of the light emitting layer, and the second sub-inclined notch surrounds the other portion of the light emitting layer.

6. The light emitting diode chip according to claim 1, wherein the light emitting diode chip is a micro light emitting diode chip, a resonant cavity light emitting diode chip, or a thin film light emitting diode chip.

7. The light emitting diode chip according to claim 1, wherein a refractive index of substance in the inclined notch is smaller than a refractive index of the first-type doped semiconductor layer, a refractive index of the second-type doped semiconductor layer, and a refractive index of the light emitting layer.

8. The light emitting diode chip according to claim 7, wherein the substance in the inclined notch is air.

9. The light emitting diode chip according to claim 7, wherein the light emitting diode chip further comprises an optical clear adhesive located in the inclined notch.

10. The light emitting diode chip according to claim 1, wherein in a cross-section of the light emitting diode chip the inclined notch is shaped as an inverted triangle, a regular triangle, a trapezoid, an inverted trapezoid, or a combination thereof.

11. The light emitting diode according to claim 1, further comprising a through hole and an insulation layer, the through hole penetrating the first-type doped semiconductor layer, the light emitting layer, and one portion of the second-type doped semiconductor layer, the insulation layer being disposed on a sidewall of the through hole and one portion of an upper surface of the first-type doped semiconductor layer, wherein the second electrode is located in the through hole and electrically connected to the second-type doped semiconductor layer, and the insulation layer is configured to electrically insulate the second electrode from the first-type doped semiconductor layer and the light emitting layer.

12. The light emitting diode chip according to claim 1, wherein a depth of the inclined notch relative to an upper surface of the first-type doped semiconductor layer is greater than a height of the light emitting layer relative to the upper surface of the first-type doped semiconductor layer.

13. The light emitting diode chip according to claim 12, wherein a ratio of the depth of the inclined notch relative to the upper surface of the first-type doped semiconductor layer to the height of the light emitting layer relative to the upper surface of the first-type doped semiconductor layer is greater than 1 but smaller than or equal to 10.

14. The light emitting diode chip according to claim 11, wherein the insulation layer is disposed in the inclined notch.

15. The light emitting diode chip according to claim 1, wherein a width of the inclined notch near the light emitting surface is smaller than a width of the inclined notch away from the light emitting surface.

16. The light emitting diode chip according to claim 1, wherein a pattern formed by the first sub-inclined notch and the second sub-inclined notch is shaped in a digit 8.

* * * * *